US010134907B2

(12) United States Patent
Guo

(10) Patent No.: US 10,134,907 B2
(45) Date of Patent: Nov. 20, 2018

(54) LOW TEMPERATURE POLYSILICON ARRAY SUBSTRATE AND METHOD FOR MANUFACTURING THE SAME

(71) Applicant: Wuhan China Star Optoelectronics Technology Co., Ltd., Wuhan, Hubei (CN)

(72) Inventor: Yuan Guo, Hubei (CN)

(73) Assignee: WUHAN CHINA STAR OPTOELECTRONICS TECHNOLOGY CO., LTD. (CN)

( * ) Notice: Subject to any disclaimer, the term of this patent is extended or adjusted under 35 U.S.C. 154(b) by 122 days.

(21) Appl. No.: 15/327,459

(22) PCT Filed: Dec. 29, 2016

(86) PCT No.: PCT/CN2016/112991
§ 371 (c)(1),
(2) Date: Jan. 19, 2017

(87) PCT Pub. No.: WO2018/119866
PCT Pub. Date: Jul. 5, 2018

(65) Prior Publication Data
US 2018/0212063 A1  Jul. 26, 2018

(51) Int. Cl.
*H01L 31/062* (2012.01)
*H01L 29/786* (2006.01)
(Continued)

(52) U.S. Cl.
CPC ...... *H01L 29/78675* (2013.01); *G02F 1/1368* (2013.01); *H01L 21/02595* (2013.01);
(Continued)

(58) Field of Classification Search
CPC .......... H01L 29/78675; H01L 29/7831; H01L 21/02595; H01L 21/02672;
(Continued)

(56) References Cited

U.S. PATENT DOCUMENTS 9,728,403 B2 * 8/2017 He ................. H01L 21/0242
2010/0283059 A1 * 11/2010 Nakazawa ........... H01L 23/552
257/66
(Continued)

FOREIGN PATENT DOCUMENTS

CN    105006486 A    10/2015
CN    105206219 A    12/2015
(Continued)

OTHER PUBLICATIONS

Search Report and Written Opinion, dated Sep. 30, 2017, for International Application No. PCT/CN2016/112991.

*Primary Examiner* — Syed Gheyas
(74) *Attorney, Agent, or Firm* — Kim Winston LLP

(57) ABSTRACT

Disclosed is a low temperature polysilicon array substrate and its manufacturing method. The method includes: forming a light-shielding layer, a buffer layer and U-type polysilicon patterns successively on a glass substrate; doping channels of the U-type polysilicon patterns in the active area and then heavily N+ doping these U-type polysilicon patterns; forming a gate insulation layer and etching first via holes; forming a gate line, a source and lightly-doped regions of the N-type double-gate transistor; and heavily P+ doping U-type polysilicon patterns in the non-active area.

18 Claims, 3 Drawing Sheets

(51) Int. Cl.
　　　*H01L 27/12*　　　(2006.01)
　　　*H01L 29/66*　　　(2006.01)
　　　*G02F 1/1368*　　(2006.01)
　　　*H01L 21/02*　　　(2006.01)
　　　*H01L 29/78*　　　(2006.01)

(52) U.S. Cl.
　　　CPC ...... *H01L 21/02672* (2013.01); *H01L 27/127* (2013.01); *H01L 27/1296* (2013.01); *H01L 29/66484* (2013.01); *H01L 29/7831* (2013.01); *H01L 29/78621* (2013.01)

(58) Field of Classification Search
　　　CPC ......... H01L 29/78621; H01L 29/66484; H01L 27/1296; H01L 27/127; G02F 1/1368
　　　See application file for complete search history.

(56) References Cited

U.S. PATENT DOCUMENTS

| | | | |
|---|---|---|---|
| 2014/0071366 A1* | 3/2014 | Zhao | G02F 1/136259 349/43 |
| 2016/0187688 A1* | 6/2016 | Wen | G02F 1/1368 349/43 |

FOREIGN PATENT DOCUMENTS

| | | | |
|---|---|---|---|
| CN | 105336683 | A | 2/2016 |
| CN | 205657056 | U | 10/2016 |
| CN | 106206622 | A | 12/2016 |
| KR | 20060017965 | A | 2/2006 |

* cited by examiner

LOW TEMPERATURE POLYSILICON ARRAY SUBSTRATE AND METHOD FOR MANUFACTURING THE SAME

CROSS-REFERENCE TO RELATED APPLICATIONS

The present application claims the priority of Chinese patent application CN 201611224492.8, entitled "Low temperature polysilicon array substrate and method for manufacturing the same" and filed on Dec. 27, 2016, the entirety of which is incorporated herein by reference.

FIELD OF THE INVENTION

The present disclosure relates to the technical field of array substrate manufacturing, and in particular, to a low temperature polysilicon array substrate and a method for manufacturing the same.

BACKGROUND OF THE INVENTION

Recent years have witnessed the continuous development of the technology of low temperature polysilicon (LTPS). Manufacturing liquid crystal display (LCD) panels by adopting LTPS technology can increase the aperture ratio, improve the luminance and reduce the power consumption of panels, applicable to manufacturing thinner products with low power consumption and high resolution.

Due to the requirement of high resolution and high performance, the present LTPS technology, compared with that of the thin-film transistor liquid crystal display (TFT-LCD), demands up to 12 procedures to complete the whole manufacturing process of the array substrate. Too many processes can lead to a significant increase in production time and production cost. Besides, complicated technology is much easier to lead to abnormal situations during the manufacturing process.

SUMMARY OF THE INVENTION

In order to solve the above problem, the present disclosure provides a low temperature polysilicon array substrate and a method for manufacturing the same to reduce the manufacturing process of an array substrate.

According to an aspect of the present disclosure, a method for manufacturing a low temperature polysilicon array substrate is provided. The method comprises the following steps.

A light-shielding layer is formed on a glass substrate. The light-shielding layer includes an array of light-shielding patterns. Light-shielding patterns that are arranged at intervals in each row are provided symmetrically with extending parts on both sides thereof in a column direction. Besides, light-shielding patterns in the column direction have a same shape.

A buffer layer is formed on the light-shielding layer and exposed portions of the glass substrate and U-type polysilicon patterns are formed on the buffer layer. Two sides of each of the patterns are shaded by two light-shielding patterns adjacent to each other in a row.

A channel of the U-type polysilicon pattern located in the active area is doped.

The U-type polysilicon patterns in the active area with doped channels are heavily N+ doped, so as to form two NMOS channels and source and drain regions of an N-type double-gate transistor. The two NMOS channels each correspond to one side of the U-type polysilicon pattern.

A gate insulation layer is formed on the NMOS channels, corresponding source and drain regions, exposed portions of the buffer layer and U-type polysilicon patterns in the non-active area and first via holes are etched. After that, a gate line, a source and lightly-doped regions of the N-type double-gate transistor are formed on the gate insulation layer. The source of the N-type double-gate transistor is connected to its corresponding light-shielding pattern through a first via hole.

U-type polysilicon patterns in the non-active area are heavily P+ doped so as to form two PMOS channels and source and drain regions of a P-type double-gate transistor. The two PMOS channels each correspond to one side of the U-type polysilicon pattern.

In one embodiment, the steps of forming the buffer layer on the light-shielding layer and the exposed portions of the glass substrate and forming the U-type polysilicon patterns on the buffer layer further comprise the following steps.

A layer of a buffer material is deposited on the light-shielding layer and the exposed portions of the glass substrate, so as to form the buffer layer.

A monocrystalline silicon material is deposited and crystallized on the buffer layer, so as to form the U-type polysilicon patterns.

In one embodiment, the steps of forming the gate insulation layer on the NMOS channels, the corresponding source and drain regions, the exposed portions of the buffer layer, and the U-type polysilicon patterns in the non-active area and forming the first via holes by etching and the step of forming the gate line, the source, the drain and the lightly-doped regions of the N-type double-gate transistor on the gate insulation layer, further comprise the following steps.

A layer of insulation material is deposited on the two NMOS channels and the source and drain regions of the N-type double-gate transistor, the exposed portions of the buffer layer, and the U-type polysilicon patterns in the non-active area, so as to form the gate insulation layer.

Two first via holes are formed by etching on positions of the gate insulation layer which correspond to the extending parts. The two first via holes are in communication with the extending parts of corresponding light-shielding patterns.

A metal material is deposited on the gate insulation layer and then etched, so as to form the gate line, and the source and the drain of the N-type double-gate transistor. The source of the N-type double-gate transistor is connected via one of the first via holes to the corresponding light-shielding pattern and the source region of the NMOS channels.

The N-type double-gate transistor is lightly N-doped, so as to form the lightly-doped regions on both sides of the NMOS channels.

In one embodiment, the gate line is arranged in the row direction and a width of the gate line is set equal to a length of the NMOS channels.

In one embodiment, sources of two N-type double-gate transistors adjacent to each other in the column direction are connected to each other via a corresponding light-shielding pattern and the other first via hole.

In one embodiment, the light-shielding layer is made of a metal material.

In one embodiment, a width of the extending part is set equal to a line width of the source of the N-type double-gate transistor.

In one embodiment, the U-type polysilicon patterns have openings facing a same direction.

In one embodiment, after the step of forming the two PMOS channels and the source and drain regions of the P-type double-gate transistor, the following steps are further comprised.

A flat layer is formed on the N-type double-gate transistor and exposed portions of the gate insulation layer.

A common electrode layer is formed on the flat layer.

A passivation layer is formed on the common electrode layer and a second via hole is formed by etching. The second via hole is in communication with the drain of the N-type double-gate transistor.

A pixel electrode layer is formed on the passivation layer and is configured to connect the drain region of the N-type double-gate transistor through the second via hole.

According to another aspect of the present disclosure, a low temperature polysilicon array substrate which is produced according to any of the above methods is provided.

The present disclosure achieves the following beneficial effects.

On the premise of not changing structure of a thin film transistor, not reducing the resolution ratio or penetration rate and not degrading the performance of the product, the method provided in the present disclosure reduces the whole manufacturing process to 10 procedures, largely reducing production cost and production time.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
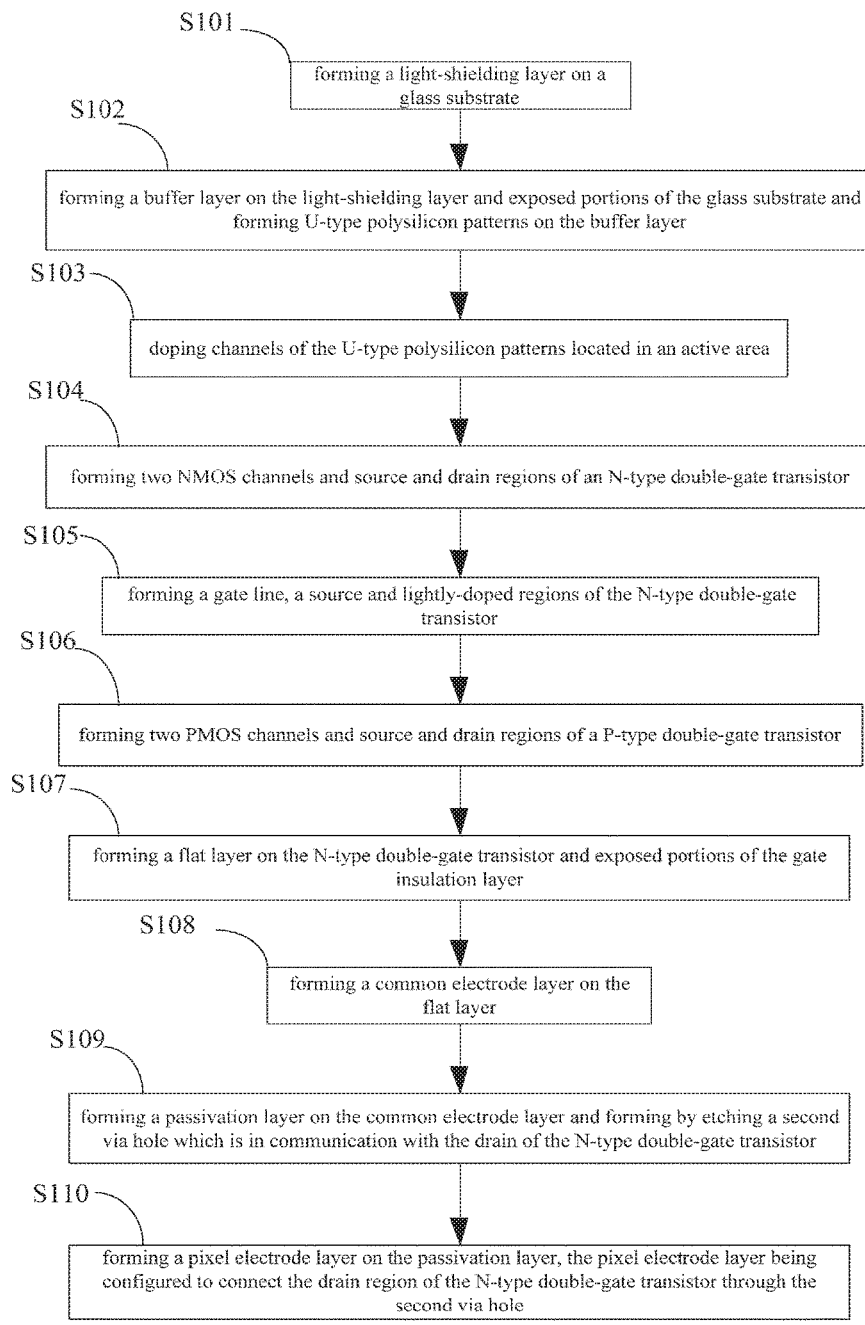
FIG. 1 shows a flow diagram of a method in an embodiment of the present disclosure.

FIG. 1 shows a flow diagram of a method in an embodiment of the present disclosure and will be referred to in the following to illustrate the present disclosure.

Firstly, in Step S101, a light-shielding layer is formed on a glass substrate. The light-shielding layer includes an array of light-shielding patterns. Light-shielding patterns that are arranged at intervals in each row are provided symmetrically with extending parts on both sides thereof in a column direction. Besides, light-shielding patterns in the column direction have a same shape.

Figure 2A:
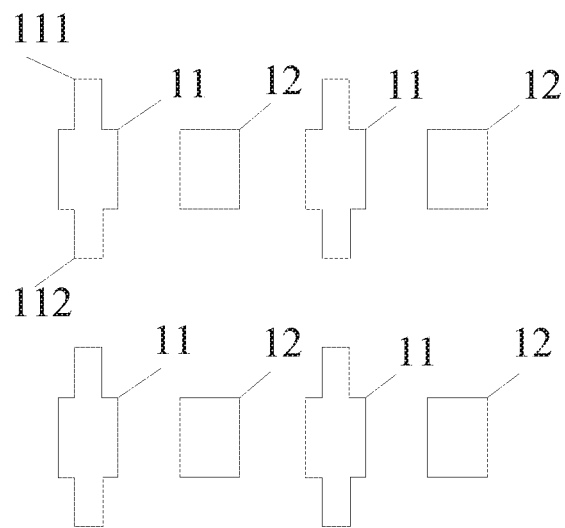
FIG. 2a schematically shows light-shielding patterns in an embodiment of the present disclosure.

Specifically, the light-shielding layer is mainly used for shading a channel region of an active area on an array substrate; therefore the light-shielding patterns of the light-shielding region are provided on the active area and are not provided on a non-active area. While the light-shielding layer is being formed, usually a layer of metal material is first deposited on the glass substrate and then etched to form a light-shielding layer. As shown in FIG. 2a, the light-shielding layer is arranged to include an array of light-shielding patterns 11 and light-shielding patterns 12. The light-shielding patterns 11 are arranged at intervals in each row and each are provided symmetrically on both sides thereof with an extending part 111 and an extending part 112 in the column direction. Light-shielding patterns in each column are identical in respect of shape. A "row direction" here is defined as a horizontal direction when one faces the array substrate.

Then, in Step S102, a buffer layer is formed on the light-shielding layer and exposed portions of the glass substrate and U-type polysilicon patterns are formed on the buffer layer. Two sides of each of the patterns are shaded by two light-shielding patterns adjacent to each other in a row.

Figure 2B:
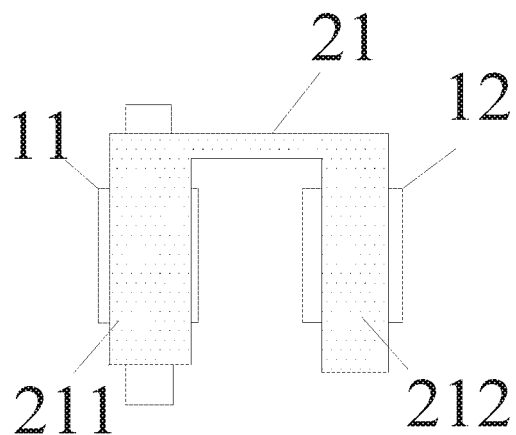
FIG. 2b schematically shows a U-type polysilicon pattern in an embodiment of the present disclosure.

Specifically, a buffer material is first deposited on the light-shielding layer and exposed portions of the glass substrate to form a buffer layer to shield defectiveness of a device caused by defects of the glass substrate. PECVD technology is usually adopted to form the buffer layer by depositing $SiO_2$ material. Then, monocrystalline silicon material is deposited on the buffer layer and crystallized to form U-type polysilicon patterns. In particular, ELA technology may be adopted to form a U-type polysilicon pattern 21. As shown in FIG. 2b, two sides 211 and 212 of the U-type polysilicon pattern 21 are shielded by two light-shielding patterns adjacent to each other in the row direction.

Next, in Step S103, a channel of the U-type polysilicon pattern located in the active area is doped. Specifically, the U-type polysilicon pattern is lightly doped with boron ions, for adjusting a threshold voltage of an N-type channel region formed in a subsequent step. The doping process may be performed on the U-type polysilicon patterns 21 in the entire active area.

Fourthly, in Step S104, the U-type polysilicon patterns in the active area with doped channels are heavily N+ doped, so as to form two NMOS channels and source and drain regions of an N-type double-gate transistor. The two NMOS channels are shaded by the light-shielding patterns. Specifically, as illustrated in FIG. 2b, one of the two NMOS channels is formed corresponding to the light-shielding pattern 11 and the other is formed corresponding to the light-shielding pattern 12; the source and drain regions correspond to ends of the two sides of the U-type polysilicon pattern.

Fifthly, in Step S105, a gate insulation layer is formed on the NMOS channels, corresponding source and drain regions, exposed portions of the buffer layer and U-type polysilicon patterns in the non-active area and first via holes are etched. After that, a gate line, a source and lightly-doped regions 213 of the N-type double-gate transistor are formed on the gate insulation layer. The source of the N-type double-gate transistor is connected to its corresponding light-shielding pattern through a first via hole.

Specifically, a layer of insulation material is first deposited on the NMOS channels, corresponding source and drain regions, exposed portions of the buffer layer and U-type polysilicon patterns in the non-active area to form a gate insulation layer GI. In this way, a gate insulation layer, which is usually made of SiNx material, is provided on an entire surface of the substrate after Step S105. Then, first via holes (not shown) are etched on positions at the gate insulation layer corresponding to the extending parts, the first via holes being in communication with the extending parts 111 and 112 of corresponding light-shielding patterns. Next, a metal material is deposited on the gate insulation layer and an etching process is performed to form a gate line 31 and a source 321, while no treatment is performed on the drain region of the N-type double-gate transistor. The source 321 of the N-type double-gate transistor is connected to a corresponding light-shielding pattern and a corresponding source region of the NMOS channel via a first via hole and to a source 322 of an adjacent N-type double-gate transistor in the longitudinal direction via a same light-shielding pattern and another first via hole. In this way, data signals can be transmitted through light-shielding patterns and no extra data lines are needed.

The gate line 31 is arranged in the row direction and is arranged to overlap the NMOS channels, so that a length of each of the NMOS channels is equal to a width of the gate line. Finally, the U-type polysilicon patterns in the active area are lightly N-doped to form lightly-doped regions on both sides of the channel regions, so as to reduce the hot carrier effect of the NMOS channels.

Figure 2C:
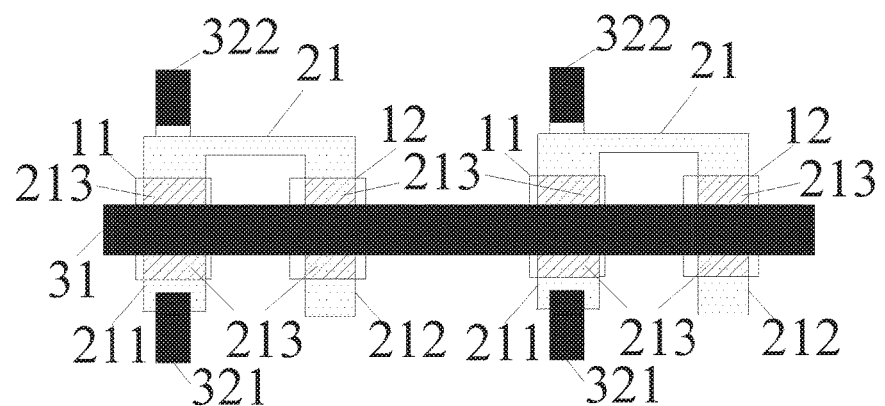
FIG. 2c schematically shows a substrate after a source and a drain are formed in an embodiment of the present disclosure.

For design convenience, the extending parts 111 and 112 each are arranged to have a width equal to a line width of the source of the N-type double-gate transistor, and opening directions of all the U-type polysilicon patterns are set to be the same, as illustrated in FIG. 2b and FIG. 2c.

Sixthly, in Step S106, U-type polysilicon patterns in the non-active area are heavily P+ doped so as to form two PMOS channels and source and drain regions of a P-type double-gate transistor. The two PMOS channels each correspond to one side of the U-type polysilicon pattern. The source region and the drain region of the P-type double-gate transistor are separately located at the ends of the two sides of the U-type polysilicon pattern.

Seventhly, in Step S107, a flat layer is formed on the N-type double-gate transistor and exposed portions of the gate insulation layer. Specifically, a layer of flattening insulation material is deposited on the N-type double-gate transistor and exposed portions of the gate insulation layer to form a flat layer.

Eighthly, in Step S108, a common electrode layer is formed on the flat layer. Specifically, a conductive material is deposited on the flat layer and then processed to form a common electrode pattern.

Figure 2D:
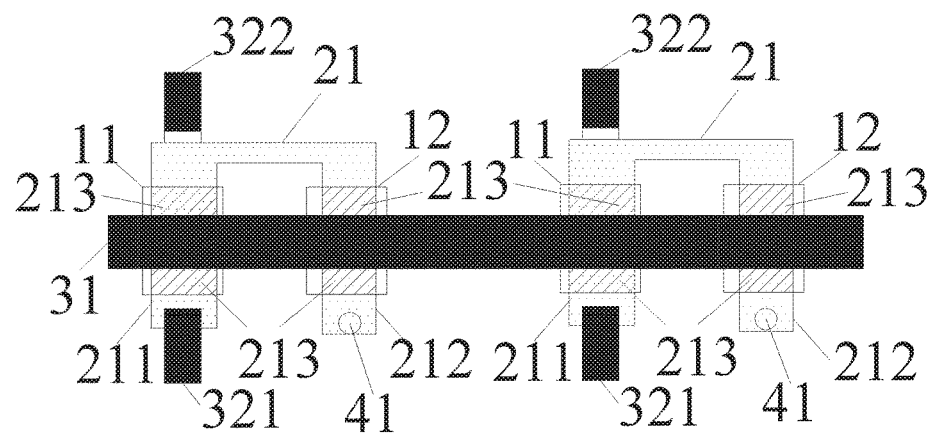
FIG. 2d schematically shows a low temperature polysilicon array substrate in an embodiment of the present disclosure.

Ninthly, in Step S109, a passivation layer is formed on the common electrode layer, and a second via hole in communication with the drain of the N-type double-gate transistor is etched. Specifically, as shown in FIG. 2d, a passivation material is deposited on the common electrode layer to form a passivation layer and the second via hole 41 is formed on the passivation layer by etching, the second via hole 41 being in communication with the drain of the N-type double-gate transistor.

Lastly, in Step S110, a pixel electrode layer is formed on the passivation the pixel electrode layer being connected to the drain region of the N-type double-gate transistor through the second via hole 41. Specifically, a layer of indium tin oxide (ITO) material is deposited on the passivation layer and then treated to form the pixel electrode layer which is connected to the drain region of the N-type double-gate transistor through the second via hole 41. It is to be noted that, the etching of the second via hole 41 goes through the common electrode layer and thus it is necessary to perform a treatment to an area on the common electrode where the second via hole goes through, in case that the pixel electrode is connected with the common electrode.

On the premise of not changing structure of a thin film transistor, not reducing the resolution ratio or penetration rate and not degrading the performance of a product, the method provided in the present disclosure reduces the whole manufacturing process to 10 procedures, largely reducing production cost and production time.

The present disclosure, at another aspect, provides a low temperature polysilicon array substrate produced according to the above method. On the premise of not changing structure of a thin film transistor, not reducing the resolution ratio or penetration rate and not degrading the performance of a product, the method provided in the present disclosure reduces the whole manufacturing process to 10 procedures, largely reducing production cost and production time.

The above embodiments are described only for better understanding, rather than restricting the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for manufacturing a low temperature polysilicon array substrate, comprising steps of:
    forming a light-shielding layer on a glass substrate, wherein the light-shielding layer comprises an array of light-shielding patterns, wherein light-shielding patterns arranged at intervals in each row are provided symmetrically on both sides thereof with extending parts in a column direction, and light-shielding patterns in the column direction have a same shape;
    forming a buffer layer on the light-shielding layer and exposed portions of the glass substrate and forming U-type polysilicon patterns on the buffer layer, wherein two sides of each of the U-type polysilicon patterns are shaded by two light-shielding patterns adjacent to each other in a row direction;
    doping channels of the U-type polysilicon patterns located in an active area;
    heavily N+ doping the U-type polysilicon patterns in the active area after the channels of the U-type polysilicon patterns are doped, so as to form two NMOS channels and source and drain regions of an N-type double-gate transistor, wherein the two NMOS channels each correspond to one side of the U-type polysilicon pattern;
    forming a gate insulation layer on the NMOS channels, corresponding source and drain regions, exposed portions of the buffer layer, and U-type polysilicon patterns in a non-active area and forming first via holes by etching, and then forming a gate line, a source and lightly-doped regions of the N-type double-gate transistor on the gate insulation layer, wherein the source of the N-type double-gate transistor is connected to its corresponding light-shielding pattern through the first via hole; and heavily P+ doping the U-type polysilicon patterns in the non-active area, so as to form two PMOS channels and source and drain regions of a P-type double-gate transistor, wherein the two PMOS channels each correspond to one side of the U-type polysilicon pattern.

2. The method according to claim 1, wherein the steps of forming the buffer layer on the light-shielding layer and the exposed portions of the glass substrate and forming the U-type polysilicon patterns on the buffer layer further comprise steps of:

depositing a layer of a buffer material on the light-shielding layer and the exposed portions of the glass substrate, so as to form the buffer layer; and depositing and crystallizing a monocrystalline silicon material on the buffer layer, so as to form the U-type polysilicon patterns.

3. The method according to claim 2, wherein the steps of forming the gate insulation layer on the NMOS channels, the corresponding source and drain regions, the exposed portions of the buffer layer, and the U-type polysilicon patterns in the non-active area and forming the first via holes by etching and the step of forming the gate line, the source, the drain and the lightly-doped regions of the N-type double-gate transistor on the gate insulation layer, further comprise steps of:

depositing a layer of insulation material on the two NMOS channels and the source and drain regions of the N-type double-gate transistor, the exposed portions of the buffer layer, and the U-type polysilicon patterns in the non-active area, so as to form the gate insulation layer;

forming two first via holes by etching on positions of the gate insulation layer which correspond to the extending parts, wherein the two first via holes are in communication with the extending parts of corresponding light-shielding patterns;

depositing a metal material on the gate insulation layer and etching the metal material, so as to form the gate line, and the source and the drain of the N-type double-gate transistor, wherein the source of the N-type double-gate transistor is connected via one of the first via holes to the corresponding light-shielding pattern and the source region of the NMOS channels; and lightly N− doping the N-type double-gate transistor, so as to form the lightly-doped regions on both sides of the NMOS channels.

4. The method according to claim 3, wherein the gate line is arranged in the row direction and a width of the gate line is set equal to a length of the NMOS channels.

5. The method according to claim 3, wherein sources of two N-type double-gate transistors adjacent to each other in the column direction are connected to each other via a corresponding light-shielding pattern and the other first via hole.

6. The method according to claim 3, wherein the light-shielding layer is made of a metal material.

7. The method according to claim 3, wherein a width of the extending part is set equal to a line width of the source of the N-type double-gate transistor.

8. The method according to claim 1, wherein the U-type polysilicon patterns have openings facing a same direction.

9. The method according to claim 1, after the step of forming the two PMOS channels and the source and drain regions of the P-type double-gate transistor, further comprising steps of:

forming a flat layer on the N-type double-gate transistor and exposed portions of the gate insulation layer;

forming a common electrode layer on the flat layer;

forming a passivation layer on the common electrode layer and forming by etching a second via hole which is in communication with the drain of the N-type double-gate transistor; and forming a pixel electrode layer on the passivation layer, wherein the pixel electrode layer is configured to connect the drain region of the N-type double-gate transistor through the second via hole.

10. A low temperature polysilicon array substrate, manufactured according to the following steps:

forming a light-shielding layer on a glass substrate, wherein the light-shielding layer comprises an array of light-shielding patterns, wherein light-shielding patterns arranged at intervals in each row are provided symmetrically on both sides thereof with extending parts in a column direction, and light-shielding patterns in the column direction have a same shape;

forming a buffer layer on the light-shielding layer and exposed portions of the glass substrate and forming U-type polysilicon patterns on the buffer layer, wherein two sides of each of the U-type polysilicon patterns are shaded by two light-shielding patterns adjacent to each other in a row direction;

doping channels of the U-type polysilicon patterns located in an active area;

heavily N+ doping the U-type polysilicon patterns in the active area after the channels of the U-type polysilicon patterns are doped, so as to form two NMOS channels and source and drain regions of an N-type double-gate transistor, wherein the two NMOS channels each correspond to one side of the U-type polysilicon pattern;

forming a gate insulation layer on the NMOS channels, corresponding source and drain regions, exposed portions of the buffer layer, and U-type polysilicon patterns in a non-active area and forming first via holes by etching, and then forming a gate line, a source and lightly-doped regions of the N-type double-gate transistor on the gate insulation layer, wherein the source of the N-type double-gate transistor is connected to its corresponding light-shielding pattern through the first via hole; and heavily P+ doping the U-type polysilicon patterns in the non-active area, so as to form two PMOS channels and source and drain regions of a P-type double-gate transistor, wherein the two PMOS channels each correspond to one side of the U-type polysilicon pattern.

11. The substrate according to claim 10, wherein the steps of forming the buffer layer on the light-shielding layer and the exposed portions of the glass substrate and forming the U-type polysilicon patterns on the buffer layer further comprise the following steps:

depositing a layer of a buffer material on the light-shielding layer and the exposed portions of the glass substrate, so as to form the buffer layer; and depositing and crystallizing a monocrystalline silicon material on the buffer layer, so as to form the U-type polysilicon patterns.

12. The substrate according to claim 11, wherein the steps of forming the gate insulation layer on the NMOS channels, the corresponding source and drain regions, the exposed portions of the buffer layer, and the U-type polysilicon patterns in the non-active area and forming the first via holes by etching, and the steps of forming the gate line, the source, the drain and the lightly-doped regions of the N-type double-gate transistor on the gate insulation layer further comprise the following steps:
- depositing a layer of insulation material on the two NMOS channels and the source and drain regions of the N-type double-gate transistor, the exposed portions of the buffer layer, and the U-type polysilicon patterns in the non-active area, so as to form the gate insulation layer;
- forming two first via holes by etching on positions of the gate insulation layer which correspond to the extending parts, wherein the two first via holes are in communication with the extending parts of corresponding light-shielding patterns;
- depositing a metal material on the gate insulation layer and etching the metal material, so as to form the gate line, and the source and the drain of the N-type double-gate transistor, wherein the source of the N-type double-gate transistor is connected via one of the first via holes to the corresponding light-shielding pattern and the source region of the NMOS channels; and
- lightly N– doping the N-type double-gate transistor, so as to form the lightly-doped regions on both sides of the NMOS channels.

13. The substrate according to claim 12, wherein the gate line is arranged in the row direction and a width of the gate line is set equal to a length of the NMOS channels.

14. The substrate according to claim 12, wherein sources of two N-type double-gate transistors adjacent to each other in the column direction are connected to each other via a corresponding light-shielding pattern and the other first via hole.

15. The substrate according to claim 12, wherein the light-shielding layer is made of a metal material.

16. The substrate according to claim 12, wherein a width of the extending part is set equal to a line width of the source of the N-type double-gate transistor.

17. The substrate according to claim 10, wherein the U-type polysilicon patterns have openings facing a same direction.

18. The substrate according to claim 10, after the step of forming the two PMOS channels and the source and drain regions of the P-type double-gate transistor, the following steps are performed:
- forming a flat layer on the N-type double-gate transistor and exposed portions of the gate insulation layer;
- forming a common electrode layer on the flat layer;
- forming a passivation layer on the common electrode layer and forming by etching a second via hole which is in communication with the drain of the N-type double-gate transistor; and
- forming a pixel electrode layer on the passivation layer, wherein the pixel electrode layer is configured to connect the drain region of the N-type double-gate transistor through the second via hole.

* * * * *